United States Patent
Yazzie et al.

(10) Patent No.: US 10,998,275 B2
(45) Date of Patent: May 4, 2021

(54) PACKAGE WITH CATHODIC PROTECTION FOR CORROSION MITIGATION

(71) Applicant: Intel Corporation, Santa Clara, CA (US)

(72) Inventors: Kyle Yazzie, Chandler, AZ (US); Mohit Mamodia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 16/465,443

(22) PCT Filed: Dec. 30, 2016

(86) PCT No.: PCT/US2016/069602
§ 371 (c)(1),
(2) Date: May 30, 2019

(87) PCT Pub. No.: WO2018/125235
PCT Pub. Date: Jul. 5, 2018

(65) Prior Publication Data
US 2020/0006256 A1  Jan. 2, 2020

(51) Int. Cl.
*H01L 23/00* (2006.01)
*H01L 23/06* (2006.01)
*H01L 23/498* (2006.01)

(52) U.S. Cl.
CPC ............ *H01L 23/564* (2013.01); *H01L 23/06* (2013.01); *H01L 23/49816* (2013.01); *H01L 23/49822* (2013.01); *H01L 23/562* (2013.01)

(58) Field of Classification Search
CPC . H01L 23/564; H01L 23/06; H01L 23/49816; H01L 23/49822; H01L 23/562;
(Continued)

(56) References Cited

U.S. PATENT DOCUMENTS

| 8,491,761 | B2 * | 7/2013 | Borregaard | ............. | C23F 13/02 |
| | | | | | 204/196.37 |
| 9,071,249 | B2 * | 6/2015 | Guard | ..................... | G06F 3/044 |

(Continued)

FOREIGN PATENT DOCUMENTS

| JP | 2014160877 | 9/2014 |
| KR | 20110098837 | 9/2011 |

OTHER PUBLICATIONS

International Search Report and Written Opinion for International Patent Application No. PCT/US16/69602 dated Sep. 29, 2017.
(Continued)

*Primary Examiner* — Karen Kusumakar
(74) *Attorney, Agent, or Firm* — Green, Howard & Mughal LLP.

(57) ABSTRACT

An apparatus is provided which comprises: a substrate to couple with one or more integrated circuit die(s), an integrated circuit die coupled to the substrate, a metal component coupled to the substrate, wherein the metal component lacks a sealing coating, and a sacrificial metal conductively coupled with the metal component, wherein the sacrificial metal comprises a more anodic metal than the metal component. Other embodiments are also disclosed and claimed.

22 Claims, 4 Drawing Sheets

(58) Field of Classification Search
CPC . H01L 2924/15192; H01L 2924/15311; H01L 2924/19105; H01L 2924/3511; H01L 2224/73204
See application file for complete search history.

(56) References Cited

U.S. PATENT DOCUMENTS

| | | | |
|---|---|---|---|
| 2008/0122081 A1* | 5/2008 | Kim | H01L 23/498 257/737 |
| 2010/0155938 A1 | 6/2010 | Martinez et al. | |
| 2012/0192645 A1 | 8/2012 | Beck et al. | |
| 2013/0003206 A1 | 1/2013 | Kabagambe et al. | |
| 2014/0022718 A1 | 1/2014 | Yamazaki et al. | |
| 2015/0137391 A1 | 5/2015 | Bez et al. | |

OTHER PUBLICATIONS

International Preliminary Report on Patentability for PCT/US16/69602 Notified on Jul. 11, 2019, 7 pgs.

\* cited by examiner

PACKAGE WITH CATHODIC PROTECTION FOR CORROSION MITIGATION

CLAIM OF PRIORITY

This Application is a National Stage Entry of, and claims priority to, PCT Application No. PCT/US16/69602, filed on 30 Dec. 2016 and titled "PACKAGE WITH CATHODIC PROTECTION FOR CORROSION MITIGATION", which is incorporated by reference in its entirety for all purposes.

BACKGROUND

Advanced microelectronic packaging utilizes different materials in unique combinations. Some materials may be susceptible to corrosion which can be accelerated in harsh environments. Advanced camera modules, such as 3-D depth sensing modules, are one type of microelectronics that utilize materials which can corrode if they use magnets or other ferromagnetic materials to drive or couple magneto-optical components. Corrosion is becoming more of a concern with advanced camera modules because they are increasingly aimed at the drone market segment, which operates in outdoor environments. While hazards such as liquid water may be obvious, water vapor in ambient air may be problematic. In particular, as drones operate higher above ground, they may be exposed to higher humidity and stronger wind. Conventional solutions to mitigate corrosion include coating components with thick layers of nickel or epoxy. This is not an optimum solution, however, when tight tolerances are required for high performance packages. Additional thickness added by coatings can break tolerance requirements. Alternative solutions involving thin film deposition, for example coating of ceramic-like materials using physical vapor deposition, may not be cost effective.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Integrated circuit packages with cathodic protection for corrosion mitigation are generally presented. In this regard, embodiments of the present invention enable corrosion mitigation that previously may have required a sealing coating of an epoxy, for example. One skilled in the art would appreciate that this cathodic protection may support tight tolerance requirements without the need for potentially expensive material coating steps.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1:
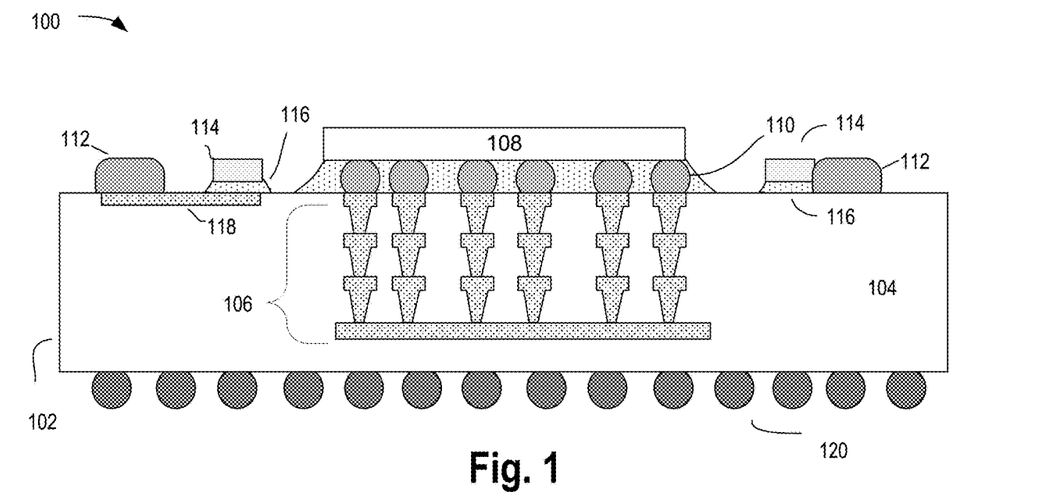
FIG. 1 illustrates a cross-sectional view of a package with cathodic protection for corrosion mitigation, according to some embodiments.

FIG. 1 illustrates a cross-sectional view of a package with cathodic protection for corrosion mitigation, according to some embodiments. As shown, package 100 includes substrate 102, dielectric layers 104, interconnects 106, integrated circuit die 108, bumps 110, metal stiffener 112, sacrificial metal 114, conductive adhesive 116, conductive trace 118, and package contacts 120.

Substrate 102 may include any number of dielectric layers 104 and interconnects 106. In some embodiments, dielectric layers 104 may include organic materials, epoxies, or other materials that are electrical insulators for interconnect 106. Interconnects 106 may include conductive planes, traces, and vias, for example of copper, to conductively couple contacts on a first surface of substrate 102, for example bumps 110, with contacts on a second surface of substrate 102, for example package contacts 120. Conductive trace 118 may be included in or on a surface of substrate 102 to conductively couple metal stiffener 112 with sacrificial metal 114. In some embodiments, conductive trace 118 is a plated surface routing opening, though conductive trace 118 may be located above or below a surface of substrate 102.

In some embodiments, bumps 110, which may represent C4 bumps for coupling with integrated circuit die 108, may be formed on a surface of substrate 102 before integrated circuit die 108 is attached, while in other embodiments, bumps 110 are formed on a surface of integrated circuit die 108 before being attached to substrate 102. While shown as including one integrated circuit die 108, embodiments of the present invention may include any number of integrated circuit dies. In some embodiments, integrated circuit die 108 may include a processor and/or a field programmable gate array (FPGA), although other devices, including controllers or memory devices, may be included.

Metal stiffener 112 may be included in package 100 to provide mechanical support for substrate 102, which may be quite thin and/or pliable. Metal stiffener 112 may be made of a metal that is susceptible to corrosion, such as steel, for example. Sacrificial metal 114 may be included in package 100 to provide corrosion mitigation to metal stiffener 112 through passive cathodic protection. Sacrificial metal 114 may act as a galvanic anode when conductively coupled with metal stiffener 112 either through direct physical contact or indirect conductive contact through conductive adhesive 116 and/or conductive trace 118. Sacrificial metal 114 may be a metal selected that has a more negative electrode potential than metal stiffener 112. When exposed to corrosive environments, sacrificial metal 114 will preferentially corrode instead of metal stiffener due to the ability of electrons to flow from the anode (sacrificial metal 114) to the cathode (metal stiffener 112). In some embodiments, sacrificial metal 114 may be zinc or magnesium or alloys of zinc or magnesium, however any metal with a more negative electrode potential than that of metal stiffener 112 may be used. Metals may be expressed as having different electrode potentials relative to a reference electrode, such as copper sulfate, in a neutral pH environment. In some embodiments, where metal stiffener 112 may comprise a mild steel with an electrode potential of between about −0.5 to −0.8, sacrificial metal 114 may, for example, comprise zinc (−1.1), magnesium alloy (−1.6), magnesium (−1.75) or other metals with a more negative electrode potential than metal stiffener 112.

Conductive adhesive 116 may comprise a solder paste adhesive, perhaps a tin-lead alloy based solder or lead-free solder, although other glues or adhesives with conductive properties may be used. Package contacts 120 may allow package 100 to be coupled with other devices, sockets, systems, etc. In some embodiments, package contacts 120 may represent solder balls, or lands, or pins.

Figure 2:
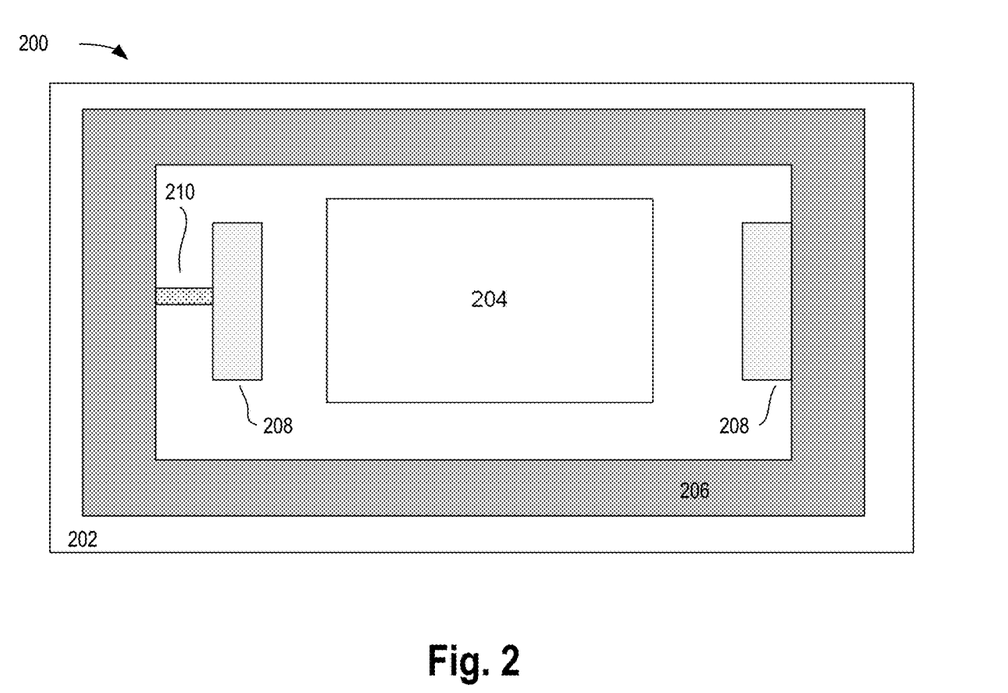
FIG. 2 illustrates an overhead view of a package with cathodic protection for corrosion mitigation, according to some embodiments.

FIG. 2 illustrates an overhead view of a package with cathodic protection for corrosion mitigation, according to some embodiments. As shown, package 200 includes substrate 202, integrated circuit die 204, metal component 206, sacrificial metal 208, and conductive trace 210.

In some embodiments, metal component 206 is a metal stiffener to provide mechanical support for substrate 202, which may be a thin coreless substrate. In some embodiments metal component 206 is a magnet that interacts with integrated circuit die 204, for example as part of a depth sensing or motion detection module. While shown as a continuous structure that completely surrounds integrated circuit die 204, metal component 206 may be discontinuous and/or might not surround integrated circuit die 204.

Sacrificial metal 208 may be included in direct physical contact with metal component 206 and/or in indirect conductive contact with metal component 206, for example through conductive trace 210, which may be in, on or under a surface of substrate 202. Sacrificial metal 208 may act as a galvanic anode to provide cathodic protection to metal component 206. Sacrificial metal 208 may be rectangular, square, or any other shape imaginable. In some embodiments, sacrificial metal 208 may have a width of about 10 mm. In some embodiments, sacrificial metal 208 has a length and a width that are less than a narrower of a length or width dimension of integrated circuit die 204.

Figure 3:
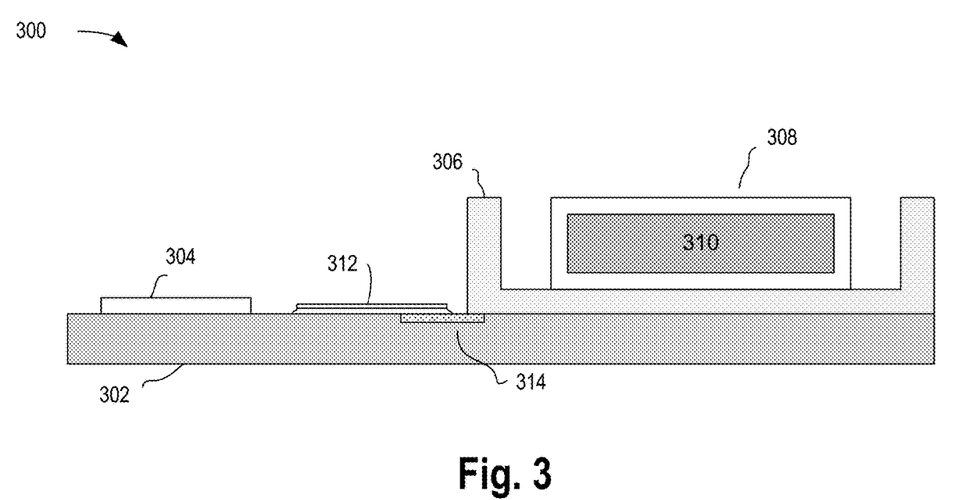
FIG. 3 illustrates a cross-sectional view of a package with cathodic protection for corrosion mitigation, according to some embodiments.

FIG. 3 illustrates a cross-sectional view of a package with cathodic protection for corrosion mitigation, according to some embodiments. As shown, package 300 includes printed circuit board 302, integrated circuit die 304, metal chassis 306, metal component 308, sacrificial metal 310, sacrificial metal 312 and conductive trace 314.

Printed circuit board 302 may include layers of dielectric and metal. In some embodiments, printed circuit board 302 includes layers of glass epoxy and patterned copper foil. Printed circuit board 302 may include surface layers of a solder resist material. Integrated circuit die 302 may be soldered to plated openings (not shown) in the solder resist material on a surface of printed circuit board 302. In some embodiments, integrated circuit die 304 is communicatively coupled with components, for example metal component 308, housed in metal chassis 306.

In some embodiments, both metal chassis 306 and metal component 308 may be metals susceptible to corrosion, for example steel. In some embodiments, sacrificial metal 310 and/or sacrificial metal 312 may be a metal with a more negative electrode potential than steel, for example zinc or magnesium or alloys thereof. In some embodiments, sacrificial metal 310, which may be adhered to metal component 308, and/or sacrificial metal 312, which may be adhered to printed circuit board 302, may provide cathodic protection to metal chassis 306 and metal component 308 either directly or indirectly through conductive trace 314, which may be a plated opening in, or trace under or over, a solder resist layer on a surface of printed circuit board 302.

Figure 4:
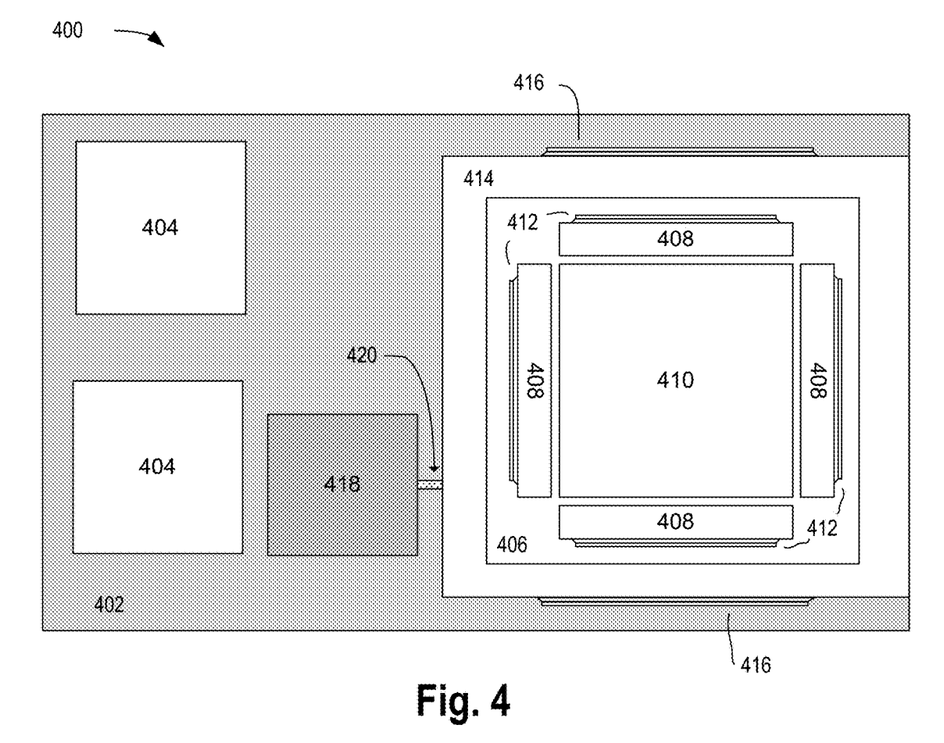
FIG. 4 illustrates an overhead view of a package with cathodic protection for corrosion mitigation, according to some embodiments.

FIG. 4 illustrates an overhead view of a package with cathodic protection for corrosion mitigation, according to some embodiments. As shown, package 400 includes printed circuit board 402, integrated circuit dies 404, chassis compartment 406, magnets 408, device 410, sacrificial metals 412, chassis walls 414, sacrificial metals 416, sacrificial metal 418, and conductive trace 420. While shown as including two integrated circuit dies 404, package 400 may include any number of integrated circuit dies.

In some embodiments, chassis compartment 406 may house components, for example magnets 408 and device 410, of a camera module. In some embodiments, device 410 is a microelectromechanical (MEMS) device. Magnets 408 may be arranged surrounding device 410. In some embodiments, magnets 408 may be rectangular cuboids with a longest dimension parallel to a surface of chassis compartment 406. In some embodiments, chassis compartment 406 and magnets 408 may be uncoated metals that could benefit from cathodic protection. One or more sacrificial metals may be conductively coupled with chassis compartment 406 and magnets 408 as galvanic anodes. In some embodiments, sacrificial metals 412 may be adhered to magnets 408 with a conductive adhesive. In some embodiments, sacrificial metals 416 may be adhered to chassis walls 414 with a conductive adhesive. In some embodiments, sacrificial metal 418 may be adhered to printed circuit board 402 and conductively coupled with chassis compartment 406 and magnets 408 through conductive trace 420.

Figure 5:
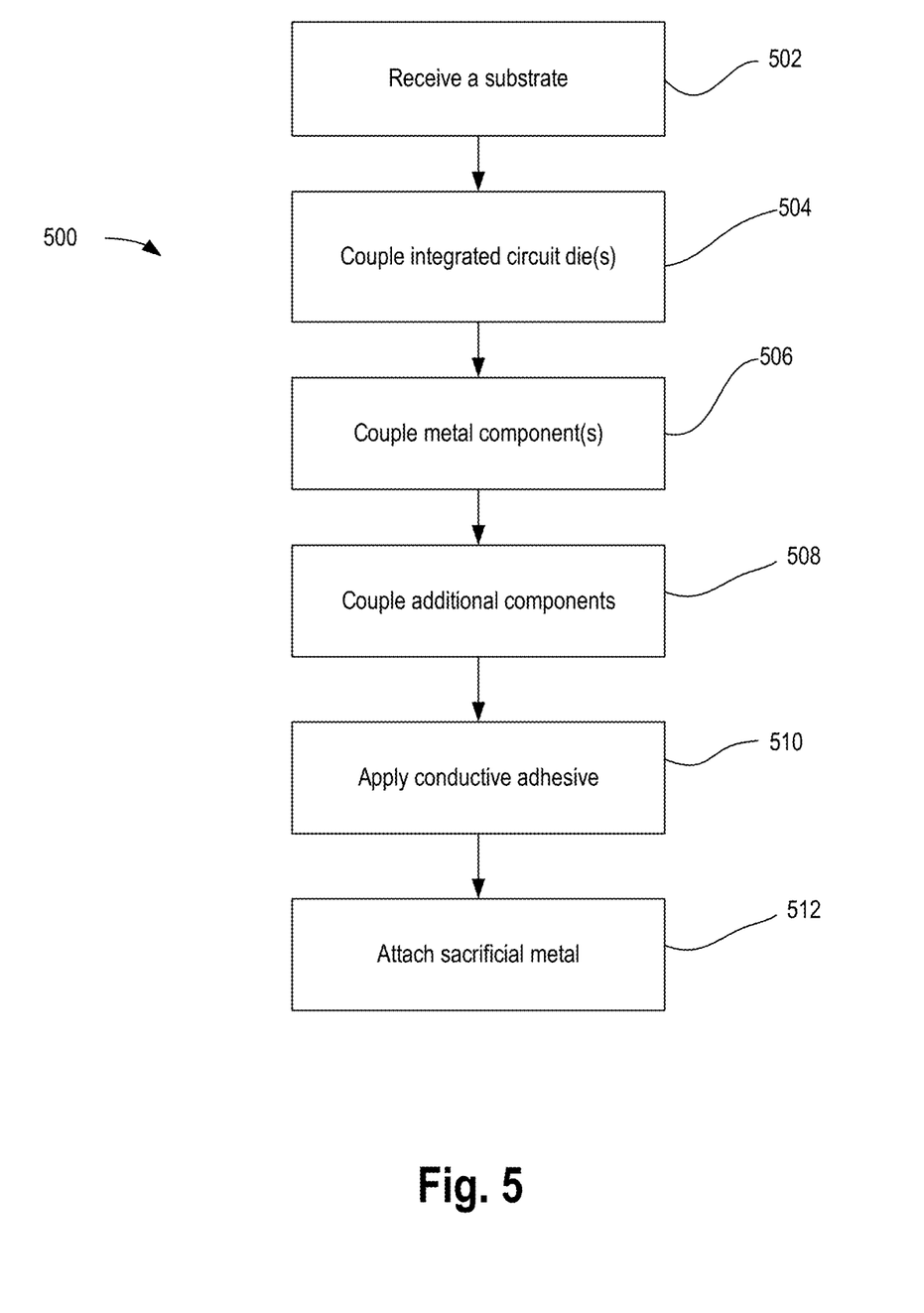
FIG. 5 illustrates a flowchart of a method of forming a package with cathodic protection for corrosion mitigation, in accordance with some embodiments.

FIG. 5 illustrates a flowchart of a method of forming a package with cathodic protection for corrosion mitigation, in accordance with some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 500 begins with receiving (502) a substrate, such as substrates 102 or 202 or printed circuit board 302 or 402. In some embodiments, the substrate or printed circuit board will have conductive traces on a surface to conductively couple a sacrificial metal (anode) with a metal to be protected (cathode). Next, integrated circuit die(s) are coupled (504) to the board or substrate.

Then, metal component(s) are coupled (506) with the board or substrate. In some embodiments, metal components, such as metal stiffener 112 or metal component 206, are adhered directly to the board or substrate, while in other embodiments, metal components, such as metal component 308 or magnets 408, are housed in a metal chassis that may be affixed to a printed circuit board. Next, in some embodiments, additional components (508) such as die side components may be attached to the board or substrate.

The method continues with applying (510) adhesive to couple sacrificial metal with the package. In some embodiments, adhesive may be applied to a surface of the sacrificial metal before attachment, while in other embodiments adhesive may be applied to a site to which the sacrificial metal is to be attached. Finally, one or more sacrificial metal(s) are attached (512) to the package. In some embodiments, multiple sacrificial metals may be attached both directly to the metal components and/or chassis to be protected and also indirectly to a substrate or printed circuit board and then conductively coupled with the metal to be protected through a conductive trace.

Figure 6:
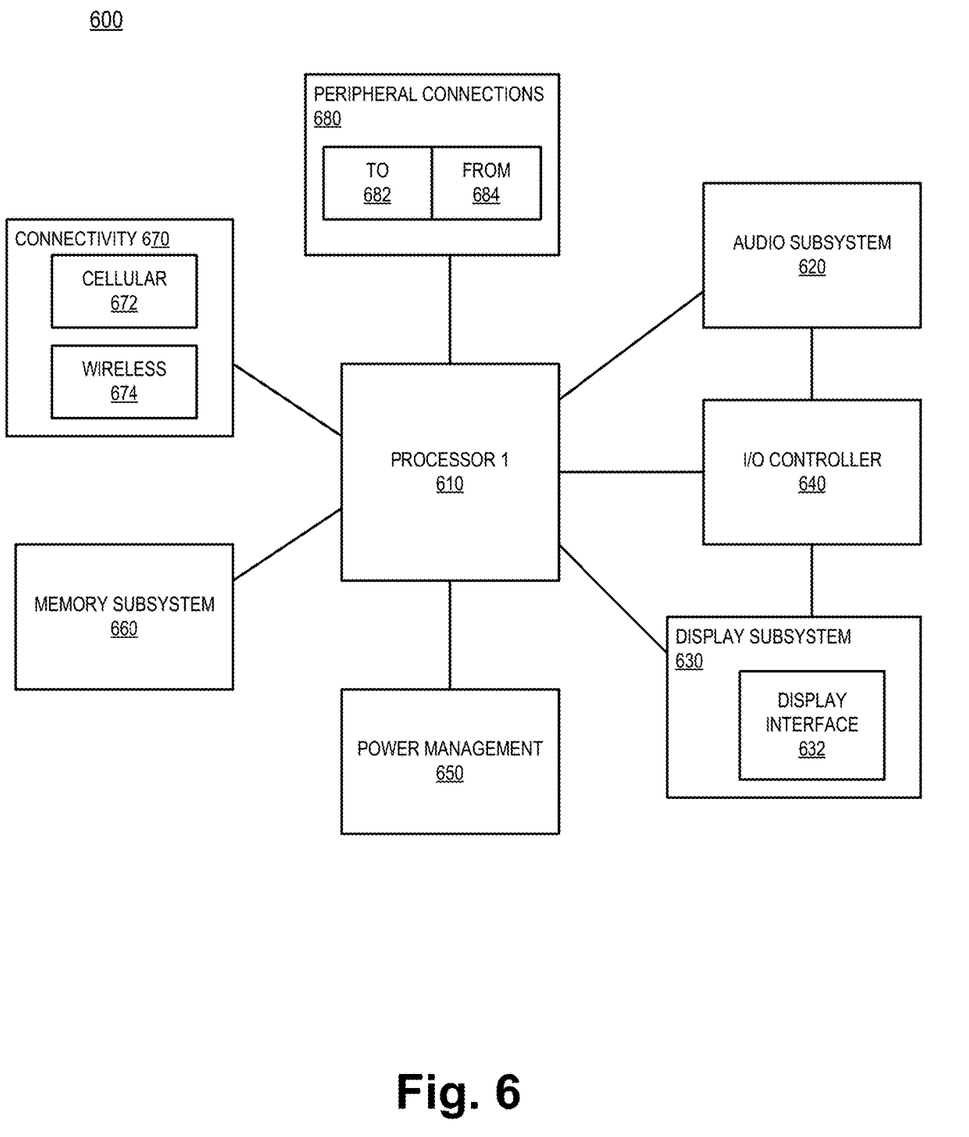
FIG. 6 illustrates a smart device or a computer system or a SoC (System-on-Chip) which includes a package with cathodic protection for corrosion mitigation, according to some embodiments.

FIG. 6 illustrates a smart device or a computer system or a SoC (System-on-Chip) 600 which includes a package with cathodic protection for corrosion mitigation, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example processor 610 and/or memory subsystem 660, are included in a package with cathodic protection for corrosion mitigation as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art).

Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a substrate to couple with one or more integrated circuit die(s); an integrated circuit die coupled to the substrate; a metal component coupled to the substrate, wherein the metal component lacks a sealing coating; and a sacrificial metal conductively coupled with the metal component, wherein the sacrificial metal comprises a more anodic metal than the metal component.

In some embodiments, the metal component comprises a magnet. Some embodiments also include a microelectromechanical (MEMS) device adjacent to the magnet. In some embodiments, the metal component comprises a stiffener support. In some embodiments, the sacrificial metal is directly attached to the metal component through a solder paste adhesive. In some embodiments, the sacrificial metal comprises zinc or magnesium.

In another example, an apparatus is provided comprising: one or more integrated circuit die(s); a metal component, wherein the metal component lacks a sealing coating; and a substrate, wherein the substrate comprises: a dielectric material; a plurality of conductive interconnects; one or more coupling site(s) for the one or more integrated circuit die(s); a sacrificial metal, wherein the sacrificial metal comprises a more anodic metal than the metal component; and a conductive trace to conductively couple the sacrificial metal with the metal component.

In some embodiments, the conductive trace comprises a trace below a substrate surface. Some embodiments also include a solder resist material over the conductive trace. In some embodiments, the substrate further comprises a conductive coupling site for the sacrificial metal. In some embodiments, the metal component comprises a magnet. In some embodiments, the sacrificial metal comprises zinc or magnesium.

In another example, a system is provided comprising: a display subsystem; a wireless communication interface; and an integrated circuit package, the integrated circuit package comprising: one or more integrated circuit die(s); a metal chassis to house one or more components; a magnet coupled with the metal chassis, wherein the magnet lacks a sealing coating; a sacrificial metal conductively coupled with the magnet, wherein the sacrificial metal comprises a more anodic metal than the magnet; and a substrate coupled with the metal chassis, wherein the substrate comprises: a dielectric material; a plurality of conductive interconnects; one or more coupling site(s) for the one or more integrated circuit die(s).

Some embodiments also include a microelectromechanical (MEMS) device coupled with the metal chassis, the MEMS device adjacent to the magnet. In some embodiments, the sacrificial metal comprises zinc or magnesium. In some embodiments, the sacrificial metal comprises a width of about 10 mm. In some embodiments, the sacrificial metal is attached to the substrate and wherein the sacrificial metal is conductively coupled with the magnet through a conductive trace. In some embodiments, the sacrificial metal is directly coupled to the magnet or metal chassis through a solder paste adhesive.

In another example, a method is provided comprising: receiving a substrate to couple with one or more integrated circuit die(s); coupling an integrated circuit die with the substrate; coupling a metal component with the substrate, wherein the metal component lacks a sealing coating; and conductively coupling a sacrificial metal with the metal component, wherein the sacrificial metal comprises a more anodic metal than the metal component.

In some embodiments, conductively coupling the sacrificial metal comprises attaching the sacrificial metal to a metal chassis housing the metal component. In some embodiments, conductively coupling comprises: forming a conductive trace on the substrate; conductively coupling the metal component to the conductive trace; and conductively coupling the sacrificial metal to the conductive trace. In some embodiments, the metal component comprises a magnet. In some embodiments, conductively coupling the sacrificial metal comprises attaching the sacrificial metal with solder paste adhesive. Some embodiments also include coupling a microelectromechanical (MEMS) device adjacent to the metal component. In some embodiments, the sacrificial metal comprises zinc or magnesium.

In another example, an integrated circuit device package with cathodic protection is provided comprising: means of forming a substrate; an integrated circuit die coupled to the substrate; a metal means coupled to the substrate, wherein the metal means lacks a sealing coating; and a sacrificial means conductively coupled with the metal means, wherein the sacrificial means comprises a more anodic metal than the metal means.

In some embodiments, the metal means comprises a magnetic means. Some embodiments also include a microelectromechanical (MEMS) means adjacent to the magnetic means. In some embodiments, the metal means comprises a stiffening means. In some embodiments, the sacrificial means is directly attached to the metal means through a conductive adhesive means. In some embodiments, the sacrificial means comprises zinc or magnesium.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a substrate to couple with one or more integrated circuit die(s);
    an integrated circuit die coupled to the substrate;
    a metal component coupled to the substrate, wherein the metal component lacks a sealing coating, wherein the metal component comprises a magnet; and
    a sacrificial metal conductively coupled with the metal component, wherein the sacrificial metal comprises a more anodic metal than the metal component.

2. The apparatus of claim 1, further comprising a microelectromechanical (MEMS) device adjacent to the metal component.

3. The apparatus of claim 1, wherein the metal component comprises a stiffener support.

4. The apparatus of claim 1, wherein the sacrificial metal is directly attached to the metal component through a solder paste adhesive.

5. The apparatus of claim 1, wherein the sacrificial metal comprises zinc or magnesium.

6. An apparatus comprising:
one or more integrated circuit die(s);
a metal component, wherein the metal component lacks a sealing coating, wherein the metal component comprises a magnet; and
a substrate, wherein the substrate comprises:
a dielectric material;
a plurality of conductive interconnects;
one or more coupling site(s) for the one or more integrated circuit die(s);
a sacrificial metal, wherein the sacrificial metal comprises a more anodic metal than the metal component; and
a conductive trace to conductively couple the sacrificial metal with the metal component.

7. The apparatus of claim 6, wherein the conductive trace comprises a trace below a substrate surface.

8. The apparatus of claim 7, further comprising a solder resist material over the conductive trace.

9. The apparatus of claim 6, wherein the substrate further comprises a conductive coupling site for the sacrificial metal.

10. The apparatus of claim 9, wherein the sacrificial metal comprises zinc or magnesium.

11. A system comprising:
a display subsystem;
a wireless communication interface; and
an integrated circuit package, the integrated circuit package comprising:
one or more integrated circuit die(s);
a metal chassis to house one or more components;
a magnet coupled with the metal chassis, wherein the magnet lacks a sealing coating;
a sacrificial metal conductively coupled with the magnet, wherein the sacrificial metal comprises a more anodic metal than the magnet; and
a substrate coupled with the metal chassis, wherein the substrate comprises:
a dielectric material;
a plurality of conductive interconnects;
one or more coupling site(s) for the one or more integrated circuit die(s).

12. The system of claim 11, further comprising a microelectromechanical (MEMS) device coupled with the metal chassis, the MEMS device adjacent to the magnet.

13. The system of claim 11, wherein the sacrificial metal comprises zinc or magnesium.

14. The system of claim 11, wherein the sacrificial metal comprises a width of about 10 mm.

15. The system of claim 11, wherein the sacrificial metal is attached to the substrate and wherein the sacrificial metal is conductively coupled with the magnet through a conductive trace.

16. The system of claim 11, wherein the sacrificial metal is directly coupled to the magnet or metal chassis through a solder paste adhesive.

17. A method comprising:
receiving a substrate to couple with one or more integrated circuit die(s);
coupling an integrated circuit die with the substrate;
coupling a metal component with the substrate, wherein the metal component lacks a sealing coating, wherein the metal component comprises a magnet; and
conductively coupling a sacrificial metal with the metal component, wherein the sacrificial metal comprises a more anodic metal than the metal component.

18. The method of claim 17, wherein conductively coupling the sacrificial metal comprises attaching the sacrificial metal to a metal chassis housing the metal component.

19. The method of claim 17, wherein conductively coupling comprises:
forming a conductive trace on the substrate;
conductively coupling the metal component to the conductive trace; and
conductively coupling the sacrificial metal to the conductive trace.

20. The method of claim 19, wherein conductively coupling the sacrificial metal comprises attaching the sacrificial metal with solder paste adhesive.

21. The method of claim 19, further comprising coupling a microelectromechanical (MEMS) device adjacent to the metal component.

22. The method of claim 19, wherein the sacrificial metal comprises zinc or magnesium.

* * * * *